United States Patent
Fan et al.

(10) Patent No.: US 12,444,691 B2
(45) Date of Patent: Oct. 14, 2025

(54) ELECTRONIC DEVICE AND METHOD OF MANUFACTURING THE SAME

(71) Applicant: InnoLux Corporation, Miao-Li County (TW)

(72) Inventors: Kuang-Ming Fan, Miao-Li County (TW); Ker-Yih Kao, Miao-Li County (TW); Sheng-Nan Chen, Miao-Li County (TW); Kuo-Sheng Yeh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 588 days.

(21) Appl. No.: 17/819,112

(22) Filed: Aug. 11, 2022

(65) Prior Publication Data
US 2023/0411301 A1 Dec. 21, 2023

(30) Foreign Application Priority Data
Jun. 15, 2022 (CN) .......................... 202210674135.0

(51) Int. Cl.
*H01L 21/68* (2006.01)
*H01L 23/544* (2006.01)

(52) U.S. Cl.
CPC ............ *H01L 23/544* (2013.01); *H01L 21/68* (2013.01); *H01L 2223/54426* (2013.01)

(58) Field of Classification Search
CPC ................... H01L 23/544; H01L 21/68; H01L 2223/54426; H01L 25/50; H01L 25/0652; H01L 23/3128; H01L 21/561; H01L 2221/68345; H01L 2221/68359; H01L 2221/68381; H01L 2223/54486; H01L 21/6835; H01L 23/3107; H01L 21/4846; H01L 21/568; H01L 23/16; H01L 23/5386; H01L 25/0655
USPC ........................................................ 257/797
See application file for complete search history.

(56) References Cited

U.S. PATENT DOCUMENTS

| | | | |
|---|---|---|---|
| 8,169,065 B2 | 5/2012 | Kohl et al. | |
| 9,048,222 B2 * | 6/2015 | Hung | H01L 23/5384 |
| 9,666,502 B2 * | 5/2017 | Chen | H01L 21/76831 |
| 9,735,131 B2 * | 8/2017 | Su | H01L 25/50 |
| 9,941,207 B2 * | 4/2018 | Lin | H01L 21/78 |
| 10,022,681 B2 | 7/2018 | Spears et al. | |
| 10,170,341 B1 * | 1/2019 | Lin | H01L 21/4853 |

(Continued)

*Primary Examiner* — Vu A Vu
(74) *Attorney, Agent, or Firm* — McClure, Qualey & Rodack, LLP

(57) ABSTRACT

An electronic device is provided. The electronic device includes a plurality of spacing elements, a first electronic unit and a second electronic unit, a protective layer and a connecting member. The first electronic unit and the second electronic unit are individually disposed between two adjacent spacing elements. The protective layer surrounds the spacing elements, the first electronic unit and the second electronic unit. The first electronic unit is electrically connected to the second electronic unit via the connecting member. In a direction that is perpendicular to a normal direction of the electronic device, the first electronic unit has a first width, and a first distance is between the two adjacent spacing elements. A ratio of the first distance to the first width is greater than or equal to 1 and less than or equal to 1.3. A method of manufacturing an electronic device is also provided.

16 Claims, 12 Drawing Sheets

(56) References Cited

U.S. PATENT DOCUMENTS

| | | | | |
|---|---|---|---|---|
| 10,381,326 B2* | 8/2019 | Woychik | ................ | H01L 24/02 |
| 10,930,596 B2* | 2/2021 | Guzek | ................ | H01L 23/48 |
| 11,309,296 B2* | 4/2022 | Lin | ................ | H01L 23/49816 |
| 11,756,802 B2* | 9/2023 | Lin | ................ | H01L 23/31 |
| | | | | 257/668 |
| 11,908,692 B2* | 2/2024 | Chen | ................ | H01L 23/5389 |
| 11,955,433 B2* | 4/2024 | Chen | ................ | H01L 23/3128 |
| 12,113,022 B2* | 10/2024 | Tseng | ................ | H01L 25/167 |

* cited by examiner

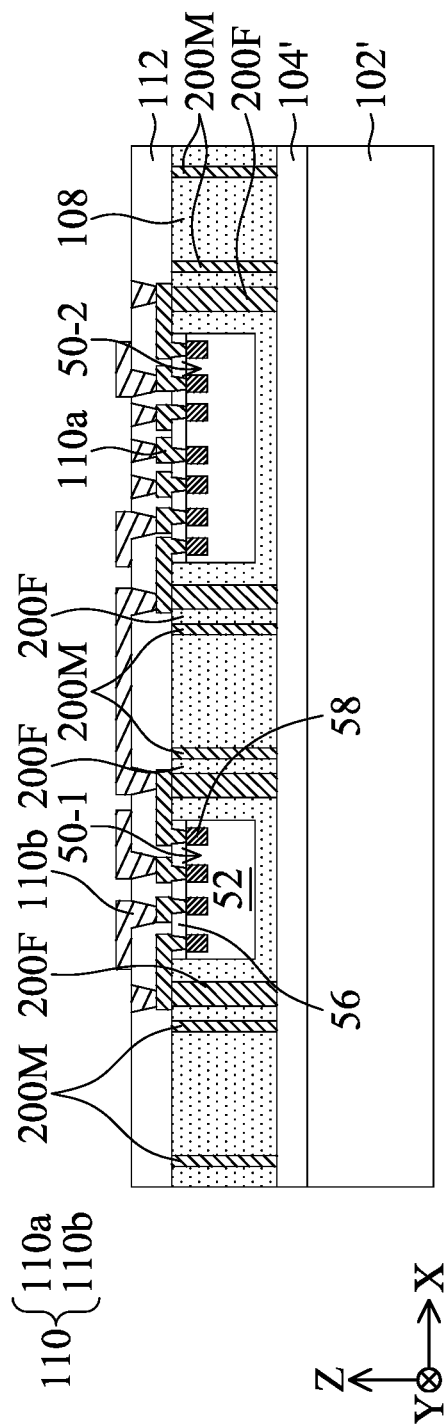
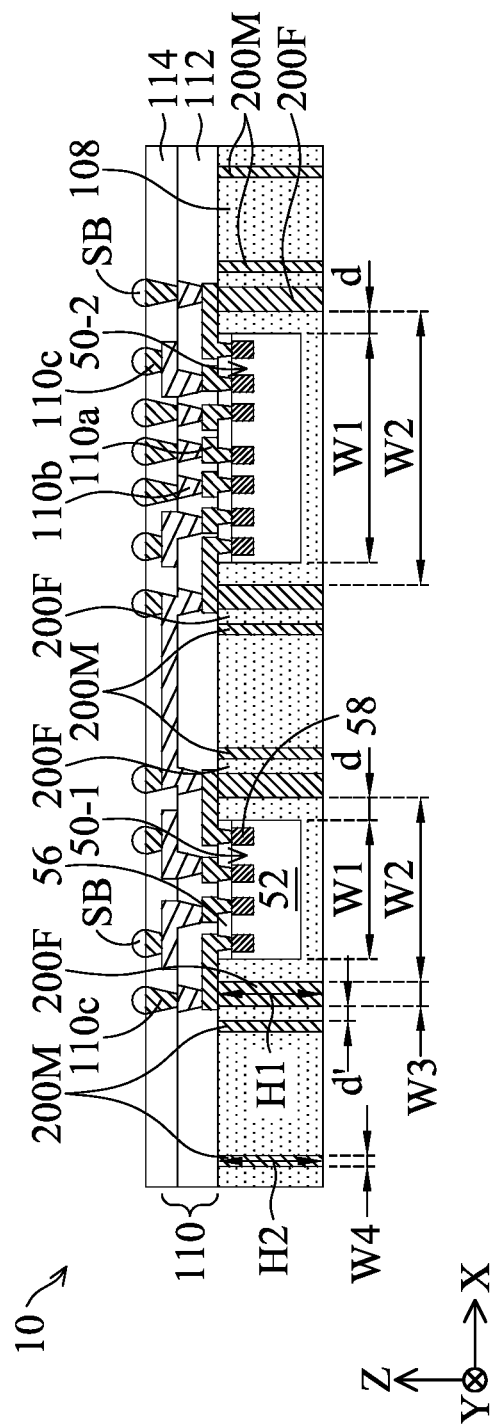
FIG. 1E
FIG. 1F

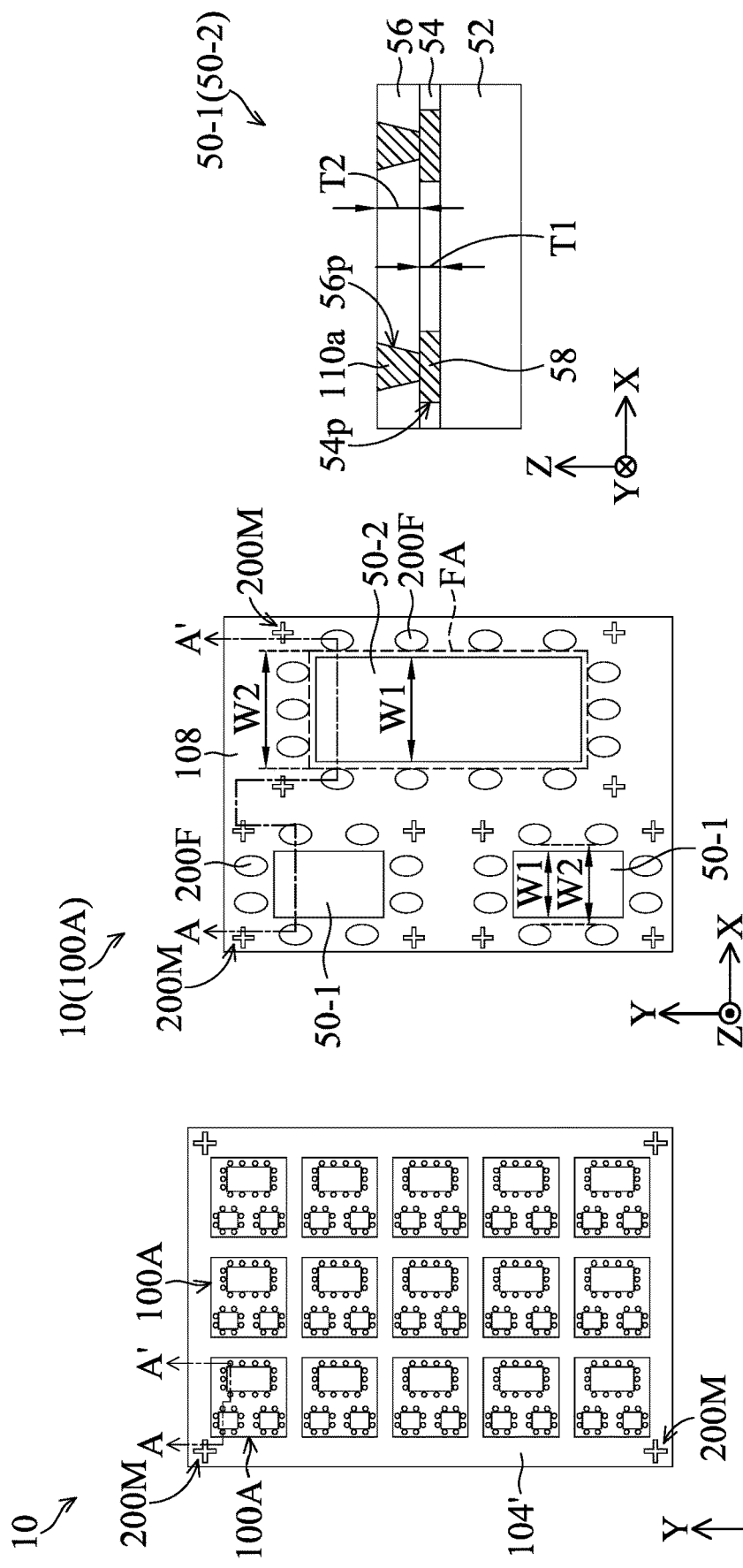

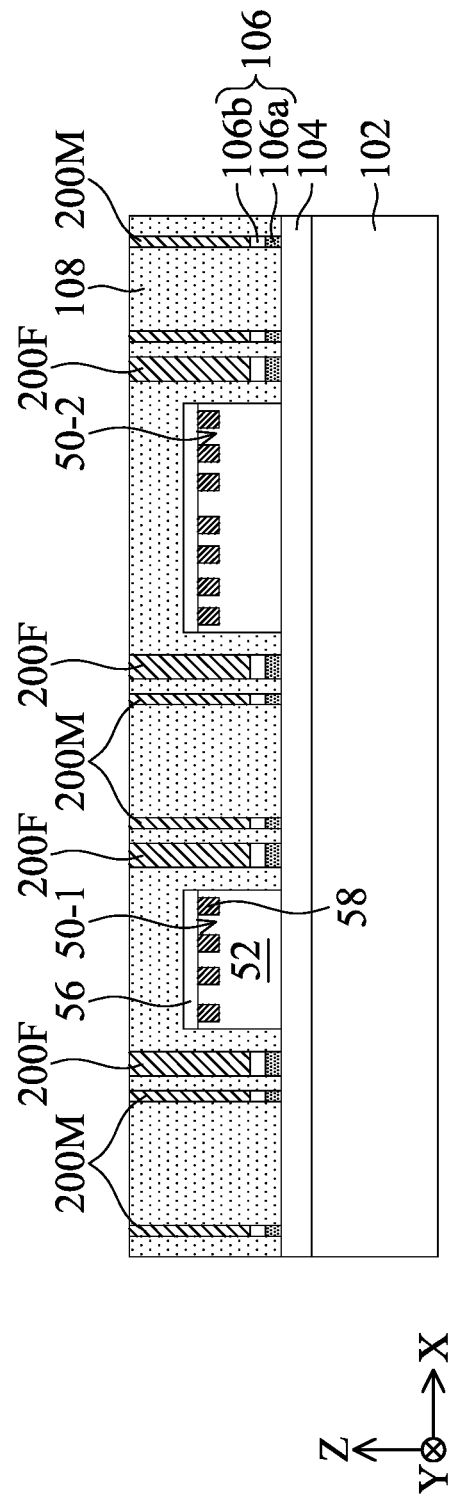
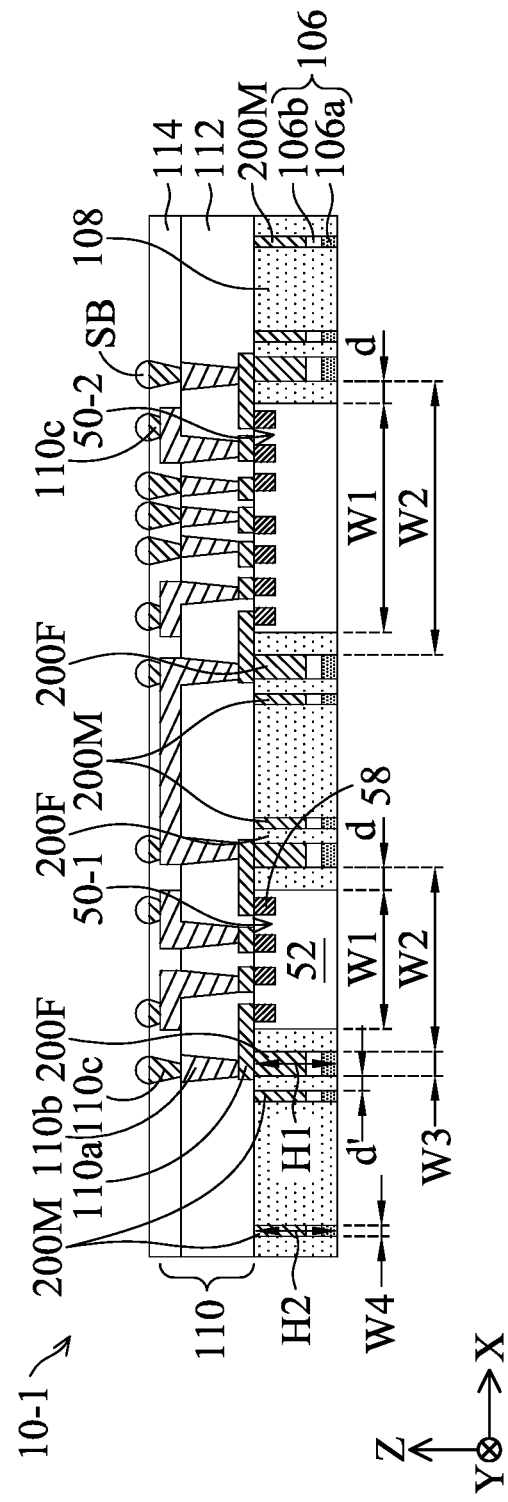
FIG. 5A
FIG. 5B

ELECTRONIC DEVICE AND METHOD OF MANUFACTURING THE SAME

CROSS REFERENCE TO RELATED APPLICATIONS

This application claims the benefit of China Application No. 202210674135.0, filed Jun. 15, 2022, the entirety of which is incorporated by reference herein.

BACKGROUND

Technical Field

The present disclosure is related to an electronic device, and in particular it is related to a package structure of an electronic device and a method of manufacturing the same.

Description of the Related Art

Fan-out panel level package (FOPLP) technology can increase the integration density of electronic components (e.g., transistors, diodes, resistors, capacitors, etc.) in a given area. It has been widely used in the manufacture of electronic devices in recent years.

In the fan-out panel level packaging process, the molding process is likely to cause chip displacement. For a product design with a single type of chip, although the displacement can be compensated for in subsequent processes, if the displacement of chips is too large, the product still needs to be scrapped, resulting in yield loss. Furthermore, for multi-chip or advanced 2.5D/3D heterogeneous integration product design, reducing the yield loss due to chip displacement is an important issue to be overcome in the large panel FOPLP development process.

In view of the foregoing, developing structures and process designs that can improve the packaging yield of electronic devices is still one of the current research topics in the industry.

SUMMARY

In accordance with some embodiments of the present disclosure, an electronic device is provided. The electronic device includes a plurality of spacing elements, a first electronic unit and a second electronic unit, a protective layer and a connecting member. The first electronic unit and the second electronic unit are individually disposed between two adjacent spacing elements. The protective layer surrounds the spacing elements, the first electronic unit and the second electronic unit. The first electronic unit is electrically connected to the second electronic unit via the connecting member. The electronic device has a normal direction. In a direction that is perpendicular to the normal direction, the first electronic unit has a first width, and a first distance is between the two adjacent spacing elements. In addition, a ratio of the first distance to the first width is greater than or equal to 1 and less than or equal to 1.3.

In accordance with some embodiments of the present disclosure, a method of manufacturing an electronic device is provided. The method includes providing a substrate. The method includes forming a photoresist layer on the substrate, wherein the photoresist layer has a plurality of openings. The method includes forming a plurality of first spacing elements in the openings. The method includes removing the photoresist layer and providing a first electronic unit and a second electronic unit. The first electronic unit and the second electronic unit are individually disposed between two adjacent first spacing elements. Moreover, the electronic device has a normal direction. In a direction that is perpendicular to the normal direction, the first electronic unit has a first width, and a first distance is between the two adjacent first spacing elements. In addition, a ratio of the first distance to the first width is greater than or equal to 1 and less than or equal to 1.3.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIGS. 1A to 1F are cross-sectional diagrams of an electronic device during different process stages in accordance with some embodiments of the present disclosure;

FIG. 2A is a top-view diagram of an electronic device in accordance with some embodiments of the present disclosure;

FIG. 2B is a partial top-view diagram of an electronic device in accordance with some embodiments of the present disclosure;

FIG. 2C is a partial cross-sectional diagram of an electronic unit in accordance with some embodiments of the present disclosure;

FIGS. 5A to 5B are cross-sectional diagrams of an electronic device during different process stages in accordance with some embodiments of the present disclosure;

DETAILED DESCRIPTION

Figure 1A:
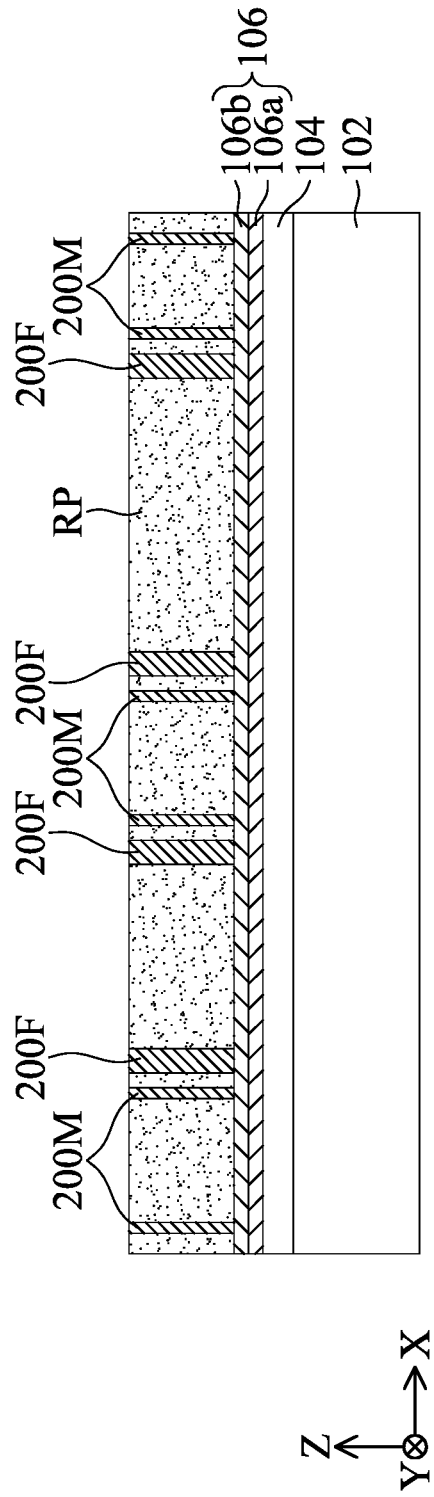

An electronic device and a method of manufacturing an electronic device according to the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on or over a second material layer" may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on or over the second material layer" means that the first material layer is in direct contact with the second material layer, and there is no intermediate element or layer between the first material layer and the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. For example, the first element in the specification may refer to the second element in the claims.

In accordance with the embodiments of the present disclosure, regarding the terms such as "connected to", "interconnected with", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "electrically coupled to" may include any direct or indirect electrical connection means.

In the following descriptions, terms "about" and "substantially" typically mean +/−10% of the stated value, or typically +/−5% of the stated value, or typically +/−3% of the stated value, or typically +/−2% of the stated value, or typically +/−1% of the stated value or typically +/−0.5% of the stated value. The expression "in a range from the first value to the second value" or "between the first value and the second value" means that the range includes the first value, the second value, and other values in between.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with the embodiments of the present disclosure, an electronic device is provided, including spacing elements that can be used as a fence structure, and an electronic unit is disposed between the spacing elements. In this way, the displacement of the electronic unit during the bonding process or the molding process can be controlled, thereby improving the yield of the packaging technology. Furthermore, the spacing elements can also be used as a conductive element for providing electrical connection between elements or for providing a heat dissipation function. In addition, in accordance with some embodiments of the present disclosure, the electronic device includes the alignment marks adjacent to the spacing elements. Therefore, there is no need to engrave marks on the substrate, so that the substrate can be reused and the production cost can be reduced.

In accordance with the embodiments of the present disclosure, the electronic device may include a display device, a backlight device, an antenna device, a touch device, a sensing device, or a tiled device, but it is not limited thereto. The electronic device may be a bendable or flexible electronic device. The display device may be a non-self-luminous display device or a self-luminous display device. The antenna device may be a liquid-crystal type antenna device or a non-liquid-crystal type antenna device. The sensing device may be a sensing device for sensing capacitance, light, heat or ultrasonic waves, but it is not limited thereto. Furthermore, the electronic device may include, for example, liquid crystal, quantum dots (QDs), fluorescence, phosphors, another suitable material, or a combination thereof. The electronic device may include electronic components, and the electronic components may include passive elements and active elements, such as, capacitors, resistors, inductors, diodes, transistors etc. The diodes may include light-emitting diodes, or photodiodes. For example, the light-emitting diodes may include organic light-emitting diodes (OLEDs), mini light-emitting diodes (mini-LEDs), micro light-emitting diodes (micro-LEDs) or quantum dot light-emitting diodes (QLEDs, QDLEDs), but they are not limited thereto. In accordance with some embodiments, the electronic device may include a panel and/or a backlight module, and the panel may include, for example, a liquid-crystal panel or another self-luminous panel, but it is not limited thereto. The tiled device may be, for example, a display tiled device or an antenna tiled device, but it is not limited thereto. It should be understood that, the electronic device may be any arrangement or combination of the foregoing, but it is not limited thereto. The electronic device will be described below by taking a display device as an example, but the present disclosure is not limited thereto.

Refer to FIGS. 1A to 1F, which are cross-sectional diagrams of an electronic device 10 during different process stages in accordance with some embodiments of the present disclosure. FIGS. 1A to 1F are cross-sectional diagrams of the electronic device 10 corresponding to the section line A-A' in FIG. 2A and FIG. 2B. It should be understood that, some elements of the electronic device 10A may be omitted in the drawings, and only some elements are schematically shown in the drawings for clarity. In accordance with some embodiments, additional features may be added to the electronic device 10A described below. In addition, it should be understood that, in accordance with some embodiments, additional steps may be added before, during, and/or after the method of manufacturing an electronic device is performed. In accordance with some embodiments, some of the steps described below may be replaced or omitted. In accordance with some embodiments, the order of some of the steps described below may be interchangeable.

In accordance with some embodiments, FIGS. 1A to 1F may be schematic diagrams of a package area 100A (e.g., as shown in FIG. 2A and FIG. 2B) in the electronic device 10. In accordance with some embodiments, the electronic device 10 may include a plurality of package areas 100A, and one or more electronic units may be packaged in one package area 100A. In accordance with some embodiments, the electronic device 10 may be packaged in a System-on-Chip (SoP), a System-in-Package (SiP), or another suitable manner. Furthermore, in accordance with some embodiments, the method of manufacturing the electronic device 10 may be applied to wafer level package (WLP) or panel level package (PLP), etc., but the present disclosure is not limited thereto.

Referring to FIG. 1A, a substrate 102 is provided, and a release layer 104 is formed on the substrate 102. The substrate 102 may be a carrier substrate. In accordance with some embodiments, the substrate 102 may include a glass carrier substrate, a ceramic carrier substrate, or another suitable substrate, but it is not limited thereto. In accordance with some embodiments, the substrate 102 may be a glass, a chip or a wafer, but it is not limited thereto.

The release layer 104 may be removed together with the substrate 102 from an overlying structure (e.g., the conductive layer 106) formed in the subsequent steps. The release layer 104 may include, but is not limited to, a polymer-based material. In accordance with some embodiments, the release layer 104 may include an epoxy-based thermal insulating material that loses its adhesion when heated, e.g., a thermal release tape (HRT), a light-to-thermal heat-conversion (LTHC) release coating. In accordance with some other embodiments, the release layer 104 may include an ultraviolet (UV) glue that loses its adhesion when exposed to UV light. In accordance with some embodiments, the release layer 104 may be formed by a coating and curing process, a lamination process, another suitable process, or a combination thereof.

As shown in FIG. 1A, a conductive layer 106 is formed on the release layer 104, and the conductive layer 106 can serve as a seed layer. In accordance with some embodiments, the conductive layer 106 is a composite layer, e.g., including a sublayer 106a and a sublayer 106b formed on sublayer 106a. In accordance with some embodiments, the sublayer 106a and the sublayer 106b may be a titanium (Ti) layer and a copper (Cu) layer, respectively, but it is not limited thereto. In accordance with some embodiments, the conductive layer 106 may be formed by a physical vapor deposition (PVD) process, an electroplating process, an electroless plating process, another suitable process, or a combination thereof.

Next, a photoresist layer PR may be formed on the conductive layer 106 so that the conductive layer 106 is located between the substrate 102 and the photoresist layer PR. In accordance with some embodiments, the photoresist layer PR may be formed by an electroplating process, a spin coating process, another suitable process, or a combination thereof, and the photoresist layer PR may be exposed for patterning. Specifically, the photoresist layer PR may be patterned so that the photoresist layer PR has a plurality of openings. The openings may penetrate the photoresist layer PR to expose the conductive layer 106.

Next, a conductive material may be formed in the openings of the photoresist layer PR and on the exposed portions of the conductive layer 106. That is, a plurality of spacing elements 200F and a plurality of alignment marks 200M are formed in the openings of the photoresist layer PR. For example, the spacing elements 200F and the alignment marks 200M may be arranged along a direction perpendicular to a normal direction of the electronic device 10 (e.g., the X direction in the drawings). In accordance with some embodiments, the alignment marks 200M and the spacing elements 200F are formed in the same process. In accordance with some embodiments, the aforementioned conductive material (i.e. the materials of the spacing element 200F and the alignment mark 200M) may include copper (Cu), titanium (Ti), aluminum (Al), tungsten (W), silver (Ag), gold (Au), tin (Sn), molybdenum (Mo), chromium (Cr), nickel (Ni), platinum (Pt), any metal alloy of the foregoing, another suitable material, or a combination thereof, but it is not limited thereto. In accordance with some embodiments, the material of the alignment mark 200M is the same as the material of the spacing element 200F. In accordance with some embodiments, the conductive material may be formed by a physical vapor deposition process, an electroplating process, an electroless plating process, another suitable process, or a combination thereof.

Moreover, after forming the spacing elements 200F and the alignment marks 200M, the photoresist layer PR may be removed. After removing the photoresist layer PR, portions of the conductive layer 106 may be exposed. In accordance with some embodiments, the remaining photoresist layer PR may be removed by a stripping process, an ashing process, or another suitable process.

Figure 1B:
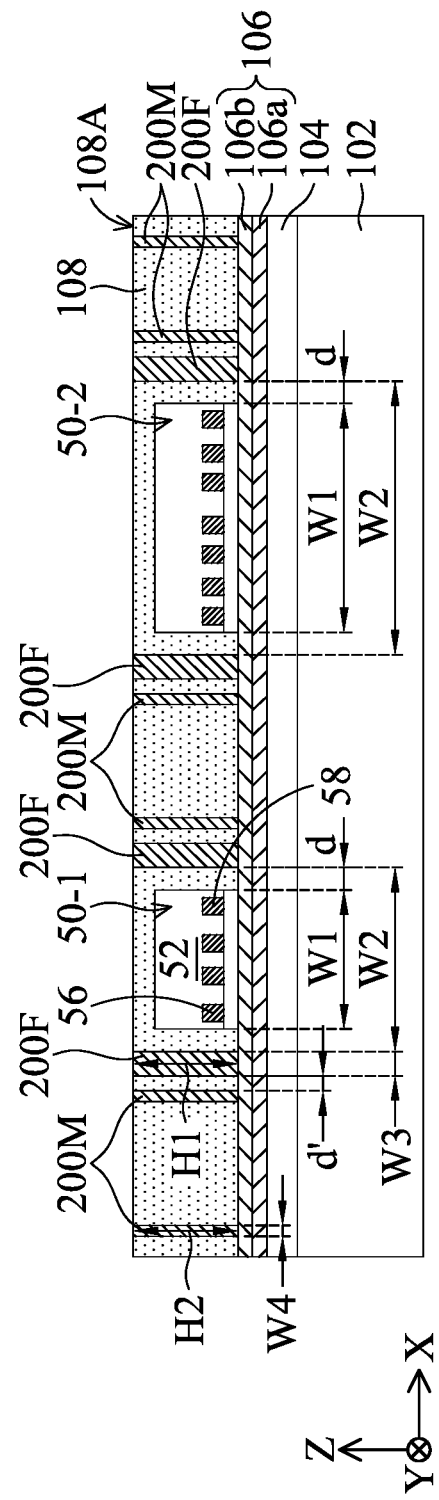

Referring to FIG. 1B, an electronic unit 50-1 and an electronic unit 50-2 are provided, and the electronic unit 50-1 and the electronic unit 50-2 are placed between the spacing elements 200F. Specifically, the electronic unit 50-1 and the electronic unit 50-2 may be individually disposed between two adjacent spacing elements 200F. In accordance with some embodiments, the electronic unit 50-1 and the electronic unit 50-2 may be fixed on the conductive layer 106 by an adhesive layer (not illustrated). It should be noted that before the electronic unit 50-1 and the electronic unit 50-2 are disposed on the substrate 102, the spacing elements 200F have been already formed, and the spacing elements 200F can serve as a fence structure to reduce the displacement of the electronic unit 50-1 and the electronic unit 50-2 in the subsequent bonding process or molding process, thereby improving the yield of the packaging technology.

Specifically, the electronic device 10 has a normal direction (e.g., the Z direction in the drawing). In a direction that is perpendicular to the normal direction (e.g., the X direction in the drawing), the electronic unit 50-1 (or the electronic unit 50-2) has a first width W1, and a first distance W2 is between two adjacent spacing elements 200F. The ratio of the first distance W2 to the first width W1 may be greater than or equal to 1 and less than or equal to 1.3 (i.e. $1 \leq W2/W1 \leq 1.3$), for example, 1.05, 1.1, 1.15, 1.2, or 1.25. In accordance with some embodiments, a second distance d between the electronic unit 50-1 (or electronic unit 50-2) and the spacing element 200F may be greater than 0 micrometer and less than or equal to 10 micrometers (i.e. $0 \text{ μm} < \text{second distance } d \leq 10 \text{ μm}$), for example, 1 μm, 2 μm, 3 μm, 4 μm, 5 μm, 6 μm, 7 μm, 8 μm or 9 μm.

In accordance with the embodiments of the present disclosure, the first width W1 refers to the maximum width of the electronic unit 50-1 (or the electronic unit 50-2) in a direction that is perpendicular to the normal direction of the electronic device 10 (e.g., the X direction in the drawings). The first distance W2 refers to the minimum distance between two spacing elements 200F between which the electronic unit 50-1 (or the electronic unit 50-2) is disposed in a direction that is perpendicular to the normal direction of the electronic device 10. Furthermore, the second distance d refers to the minimum distance between the electronic unit 50-1 (or the electronic unit 50-2) and the closest spacing element 200F in a direction that is perpendicular to the normal direction of the electronic device 10 (e.g., the X direction in the drawings).

Moreover, it should be understood that, in accordance with the embodiments of the present disclosure, a scanning electron microscope (SEM), an optical microscope (OM), a film thickness profiler (α-step), an ellipsometer or another suitable method can be used to measure the width, thickness, or height of an element, or the spacing or distance between elements. Specifically, in accordance with some embodiments, a scanning electron microscope can be used to obtain a cross-sectional image including the element to be measured, and the width, thickness, or height of an element, or the spacing or distance between elements in the image can be measured.

Furthermore, in accordance with some embodiments, the electronic unit 50-1 and the electronic unit 50-2 may include integrated circuits (ICs), capacitors, sensors, resistors, printed circuit boards (PCBs), diodes, another suitable electronic component or a combination thereof, but they are not limited thereto. The electronic unit 50-1 and the electronic unit 50-2 may be the same or different types of electronic units. The electronic unit and the electronic unit 50-2 may have the same or different dimensions (e.g., height and/or width). Furthermore, the number of electronic units is not limited to those shown in the drawings. According to different embodiments, the electronic device may have any suitable number of electronic units.

Refer to FIG. 1B and FIG. 2C at the same time. FIG. 2C is a partial cross-sectional diagram of the electronic unit 50-1 (electronic unit 50-2) in accordance with some embodiments of the present disclosure. It should be understood that FIG. 2C only shows the partial structure, and does not entirely correspond to the structure shown in FIG. 1B. In accordance with some embodiments, the electronic unit 50-1 (electronic unit 50-2) includes a chip 52, a first insulating layer 54 (not illustrated in FIG. 1B), and a second insulating layer 56. The chip 52 may have a plurality of bonding pads 58. The first insulating layer 54 may be disposed on the chip 52. The first insulating layer 54 may have a plurality of first openings 54$p$, and the first openings 54$p$ may be disposed to correspond with the bonding pads 58. The second insulating layer 56 may be disposed on the first insulating layer 54. The second insulating layer 56 may have a plurality of second openings 56$p$, and the second openings 56$p$ may be disposed to correspond with the bonding pads 58. The detailed structure of the electronic unit 50-1 (electronic unit 50-2) will be further described in the following context. In accordance with some embodiments, the chip 52 may be, for example, a known-good die (KGD), an integrated circuit (IC) chip, a diode chip, a semiconductor chip, a capacitor chip, or the like.

In addition, in this embodiment, the method of manufacturing the electronic device 10 adopts a chip-first and face-down bonding process. That is, the bonding pads 58 of the electronic unit 50-1 and the electronic unit 50-2 face downward, and are placed in such a manner that the bonding pads 58 are closer to the substrate 102.

As shown in FIG. 1B, after the step of providing the electronic unit 50-1 and the electronic unit 50-2, a protective layer 108 is formed to surround the spacing elements 200F, the electronic unit 50-1 and the electronic unit 50-2. In addition, the protective layer 108 may also surround the alignment marks 200M. In accordance with some embodiments, in a cross-sectional view, the protective layer 108 is in contact with at least two side surfaces of the spacing elements 200F, the electronic unit 50-1, the electronic unit 50-2 and the alignment marks 200M. The protective layer 108 may be a packaging material, and the spacing elements 200F, the alignment marks 200M, the electronic unit 50-1 and the electronic unit 50-2 may be packaged and integrated on the conductive layer 106. The protective layer 108 is in contact with at least one surface of the spacing elements 200F, the electronic unit 50-1 and the electronic unit 50-2, so that the effect of water and oxygen in the environment on the spacing elements 200F, the electronic unit 50-1 and the electronic unit 50-2 can be reduced, or the scratches caused by the subsequent processes to the spacing elements 200F, the electronic unit 50-1 and the electronic unit 50-2 can be reduced, but it is not limited thereto. In accordance with some embodiments, the protective layer 108 may include a molding compound, epoxy, another suitable encapsulation material, or a combination thereof, but it is not limited thereto. In accordance with some embodiments, the protective layer 108 may be formed by a compression molding process, a transfer molding process, or another suitable process. In accordance with some embodiments, the protective layer 108 may undergo a molding process in a liquid or semi-liquid form and then be cured.

In addition, in accordance with some embodiments, the protective layer 108 may cover the spacing elements 200F, the alignment marks 200M, the electronic unit 50-1 and the electronic unit 50-2, and then a planarization process may be performed on the protective layer 108 to expose the spacing elements 200F and the alignment marks 200M. After the planarization process, the spacing elements 200F, the alignment marks 200M, and the surface 108A of the protective layer 108 may be coplanar. In accordance with some embodiments, the planarization process may include a grinding process, a chemical-mechanical polish (CMP) process, another suitable planarization process, or a combination thereof.

In accordance with some embodiments, in a cross-sectional view, a distance d' is between the spacing element 200F and the alignment mark 200M. Specifically, the spacing element 200F and the alignment mark 200M are separated from each other, and the spacing element 200F and the alignment mark 200M are electrically-insulated from each other. In accordance with some embodiments, in a cross-sectional view, the spacing element 200F has a width W3, the alignment mark 200M has a width W4, and the width W4 is less than or equal to half of the width W3 (i.e. W4≤½× W3). In accordance with some embodiments, W4≤⅓×W3. With the above configuration, the spacing elements 200F and the alignment marks 200M can be formed by the same process, which can reduce the number of process steps, improve the alignment accuracy or electrical connection design so that the fan-out design of the electronic device 10 can be improved, but the present disclosure is not limited thereto.

Moreover, in accordance with some embodiments, in the normal direction of the electronic device 10 (e.g., the Z direction in the drawings), the spacing element 200F has a first height H1, the alignment mark 200M has a second height H2, and the ratio of the second height H2 to the first height H1 may be greater than or equal to 0.5 and less than or equal to 1.2 (i.e. 0.5≤H2/H1≤1.2), for example, 0.6, 0.7, 0.8, 0.9, 1 or 1.1.

In accordance with the embodiments of the present disclosure, the first height H1 refers to the maximum height of the spacing element 200F in the protective layer 108 in the normal direction of the electronic device 10 (e.g., the Z direction in the drawings). The second height H2 refers to the maximum height of the alignment mark 200M in the protective layer 108 in the normal direction of the electronic device 10. Moreover, if a planarization process is performed on the protective layer 108, the aforementioned first height H1 and second height H2 are measured after the planarization process is performed.

Figure 1C:
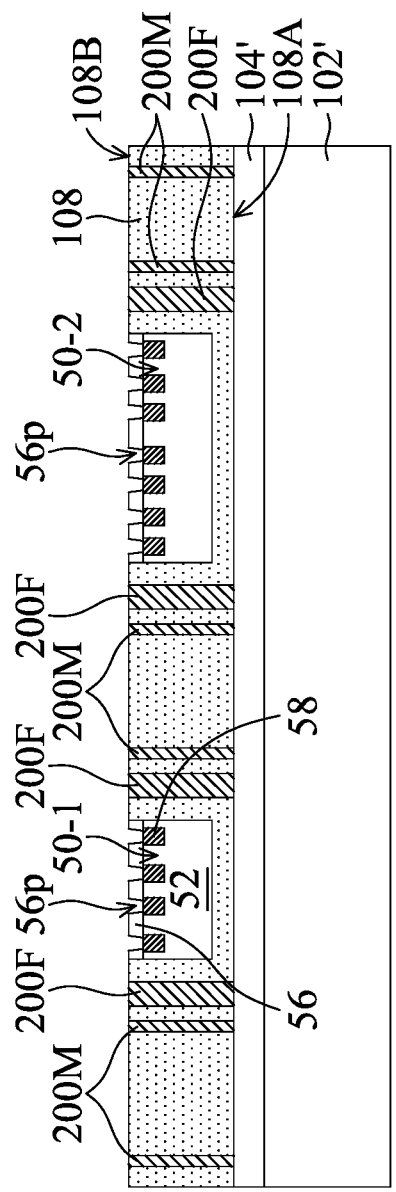

Referring to FIG. 1C, after the protective layer 108 is formed, the release layer 104 is heated, so that the conductive layer 106 and the spacing elements 200F, the alignment marks 200M, the electronic unit 50-1 and the electronic unit 50-2 packaged and integrated on the conductive layer 106 are separated from the release layer 104 and the substrate 102. In accordance with some embodiments, after the substrate 102 is removed, the conductive layer 106 may be removed by an etching process. The etching process may include a dry etching process or a wet etching process, or another suitable etching process. Then, the aforementioned packaged and integrated structure (the spacing elements 200F, the alignment marks 200M, the electronic unit 50-1 and the electronic unit 50-2) may be turned over and placed on another substrate 102'. The surface 108A of the protective layer 108 that is originally on the top may be disposed on another release layer 104', and the surface 108B of the protective layer 108 that is originally on the bottom may be exposed.

Next, portions of the second insulating layer 56 may be removed to form a plurality of second openings 56p, and the second openings 56p may expose the bonding pads 58. In the normal direction of the electronic device 10 (e.g., the Z direction in the drawing), the second opening 56p at least partially overlaps the bonding pad 58. In accordance with some embodiments, portions of the second insulating layer 56 may be removed by a laser drilling process, or one or more photolithography processes and/or etching processes or another suitable process to form the second openings 56p. In accordance with some embodiments, the photolithography process may include photoresist coating (e.g., spin coating), soft baking, hard baking, mask alignment, exposure, post-exposure baking, photoresist development, washing and drying, etc., but it is not limited thereto. The etching process may include a dry etching process or a wet etching process, but it is not limited thereto. In accordance with some embodiments, the material of the bonding pad 58 may include aluminum, copper, tin, nickel, transparent conductive materials, or another suitable conductive material, but it is not limited thereto.

Figure 1D:
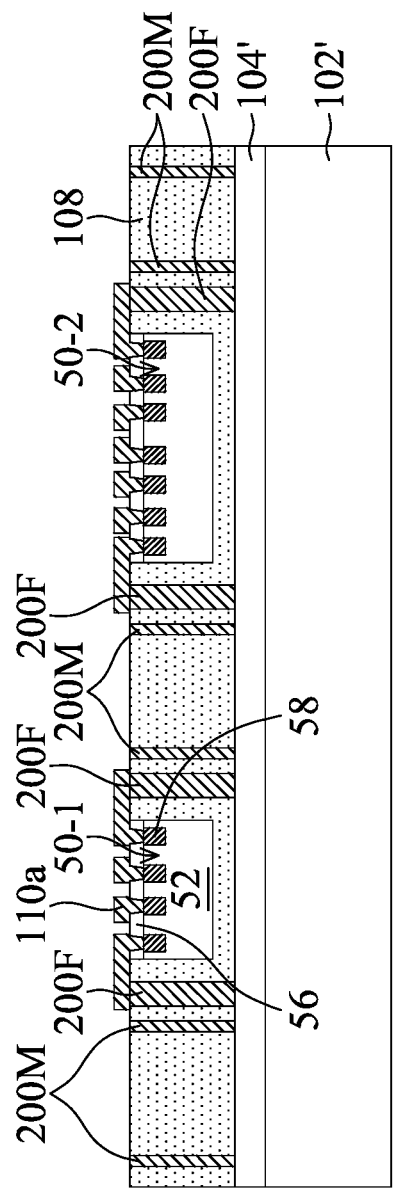

Referring to FIG. 1D, a patterned conductive layer 110a may be formed on the protective layer 108 and located above the electronic unit 50-1 and the electronic unit 50-2. The patterned conductive layer 110a may be filled in the second opening 56p and in contact with the bonding pads 58. In addition, the patterned conductive layer 110a may also be in contact with a surface of the spacing element 200F, a surface of the protective layer 108 and a surface of the second insulating layer 56. In this way, the spacing element 200F can be electrically connected to the electronic unit 50-1 (electronic unit 50-2) through the patterned conductive layer 110a. Specifically, the patterned conductive layer 110a may be a part of a connecting member 110 (as shown in FIG. 1E), and the connecting member 110 may serve as a redistribution layer (RDL) of the electronic device 10. In accordance with some embodiments, the connecting member 110 may include electronic components such as transistors, capacitors, or resistors, but it is not limited thereto. In accordance with some embodiments, the patterned conductive layer 110a may include a conductive material, for example, may include copper (Cu), titanium (Ti), aluminum (Al), tungsten (W), silver (Ag), gold (Au), tin (Sn), molybdenum (Mo), chromium (Cr), nickel (Ni), platinum (Pt), any metal alloy of the foregoing, another suitable material, or a combination thereof, but it is not limited thereto. In accordance with some embodiments, the conductive material may be formed by a physical vapor deposition process, an electroplating process, an electroless plating process, another suitable process, or a combination thereof. Moreover, the conductive material may be patterned by one or more photolithography processes and/or etching processes to form the patterned conductive layer 110a.

Referring to FIG. 1E, after the patterned conductive layer 110a is formed, an insulating layer 112 may be formed on the patterned conductive layer 110a. In accordance with some embodiments, the insulating layer 112 may include a polymer material, for example, may include polybenzoxazole (PBO), polyimide, benzocyclobutene (BCB), another suitable polymer material or a combination thereof, but it is not limited thereto. In accordance with some other embodiments, the insulating layer 112 may include silicon nitride, silicon oxide, silicon oxynitride, phosphosilicate glass (PSG), borosilicate glass (BSG), boron-doped phosphosilicate glass (BPSG), another suitable material, or a combination thereof, but it is not limited thereto. In accordance with some embodiments, the insulating layer 112 may be formed by a coating process, a spin coating process, a chemical vapor deposition (CVD) process, another suitable process, or a combination thereof.

Next, the insulating layer 112 may be patterned to form openings (not labeled) that expose portions of the patterned conductive layer 110a. In accordance with some embodiments, the insulating layer 112 may be patterned by one or more photolithography and/or etching processes. Next, a patterned conductive layer 110b may be formed on the insulating layer 112 and located above the electronic unit 50-1 and the electronic unit 50-2. The patterned conductive layer 110b may be filled in the openings of the insulating layer 112 and in contact with the patterned conductive layer 110a, and the patterned conductive layer 110b then may be electrically connected to the patterned conductive layer 110a. Furthermore, the patterned conductive layer 110b may be a part of the connecting member 110, and the connecting member 110 may serve as a redistribution structure. In this way, the electronic unit 50-1 can be electrically connected to the electronic unit 50-2 via the connecting member 110. In addition, the material and process of forming the patterned conductive layer 110b may be the same as or similar to that of the aforementioned patterned conductive layer 110a, and thus will not be repeated here.

It should be noted that, in accordance with some embodiments, the spacing elements 200F are electrically connected to the patterned conductive layer 110a and the patterned conductive layer 110b, which serve as the redistribution structure; the spacing elements 200F thereby are electrically connected to the electronic unit 50-1 (electronic unit 50-2) and serve as one of the elements for signal transmission. Furthermore, the spacing elements 200F can also provide a heat dissipation function. For example, the heat transfer coefficient of the spacing element 200F may be between 237 W/mK and 429 W/mK, but it is not limited thereto.

It should be understood that, according to different embodiments, the redistribution structure may include any suitable number of insulating layers and patterned conductive layers, e.g., one or more insulating layers and patterned conductive layers. If more insulating layers and patterned conductive layers are to be formed, the aforementioned steps and processes can be repeated.

Referring to FIG. 1F, an insulating layer 114 then may be formed on the insulating layer 112, and the insulating layer 114 may cover the patterned conductive layer 110b. The material and process of forming the insulating layer 114 may be the same as or similar to that of the aforementioned insulating layer 112, and thus will not be repeated here. Next, the insulating layer 114 may be patterned to form openings (not labeled) that expose portions of the patterned conductive layer 110b. In accordance with some embodiments, the insulating layer 114 may be patterned by one or more photolithography processes and/or etching processes. After that, a patterned conductive layer 110c may be formed on the insulating layer 114 and located above the electronic unit 50-1 and the electronic unit 50-2. The patterned conductive layer 110c may be filled in the openings of the insulating layer 114 and in contact with the patterned conductive layer 110b, and the patterned conductive layer 110c then may be electrically connected to the patterned conductive layer 110b. In addition, the material and process of forming the patterned conductive layer 110c may be the same as or similar to that of the aforementioned patterned conductive layer 110a, and thus will not be repeated here.

Next, solder pads SB may be formed on the insulating layer 114, and the solder pads SB may be disposed to correspond with the patterned conductive layer 110c. In accordance with some embodiments, the solder pad SB may be a contact bump. Specifically, the patterned conductive layer 110c can serve as an under bump metallurgy (UBM) to be electrically connected to the solder pads SB, so that the electronic unit 50-1 (electronic unit 50-2) can be electrically connected to an external device (not illustrated). In accordance with some embodiments, the material of the solder pad SB may include tin, silver, lead-free tin, copper, another suitable material, or a combination thereof, but it is not limited thereto. In accordance with some embodiments, the solder pad SB is bonded to the patterned conductive layer 110c by a reflow process, a fusion bonding process, a hybrid bonding process, a metal-to-metal bonding process, another suitable process, or a combination thereof. In accordance with some embodiments, the under bump metallurgy is a patterned conductive layer that is in contact with solder pad SB.

In accordance with some embodiments, the release layer 104' may be subsequently heated to remove the release layer 104' and the substrate 102' to obtain the electronic device 10.

As shown in FIG. 1F, the electronic device 10 formed by the aforementioned manufacturing method may include a plurality of spacing elements 202F, an electronic unit an electronic unit 50-2, a protective layer 108, and a connecting member 110. The electronic unit 50-1 and the electronic unit 50-2 may be individually disposed between two adjacent spacing elements 202F. The protective layer 108 may surround the spacing elements 202F, the electronic unit 50-1 and the electronic unit 50-2. The electronic unit 50-1 may be electrically connected to the electronic unit 50-2 via the connecting member 110. The electronic device 10 has a normal direction (e.g., the Z direction in the drawing). In a direction that is perpendicular to the normal direction (e.g., the X direction in the drawing), the electronic unit 50-1 (electronic unit 50-2) may have a first width W1, a first distance W2 may be between two adjacent spacing elements 202F, and the ratio of the first distance W2 to the first width W1 may be greater than or equal to 1 and less than or equal to 1.3. Through the design of the first distance W2 and the first width W1, the alignment accuracy of the electronic device can be improved, or the risk of collision and scratches on the chip can be reduced, but it is not limited thereto.

In accordance with some embodiments, two adjacent spacing elements 200F may be electrically connected to the electronic unit 50-1 (electronic unit 50-2) via the connecting member 110. In accordance with some embodiments, the electronic device 10 may further include an alignment mark 200M, and the protective layer 108 may surround the alignment mark 200M. In accordance with some embodiments, the material of the alignment mark 200M may be the same as the material of the spacing element 200F. In accordance with some embodiments, in the normal direction of the electronic device 10, the spacing element 200F may have a first height H1, the alignment mark 200M may have a second height H2, and the ratio of the second height H2 to the first height H1 may be greater than or equal to 0.5 and less than or equal to 1.2.

Refer to FIG. 2A and FIG. 2B, which are top-view diagrams of the electronic device 10 in accordance with some embodiments of the present disclosure. As mentioned above, the section line A-A' in FIG. 2A and FIG. 2B may correspond to the cross-sectional diagrams of the electronic device 10 shown in FIGS. 1A to 1F. The electronic device 10 may include a plurality of package areas 100A, and a plurality of electronic units (e.g., the electronic unit 50-1 and the electronic unit 50-2) may be packaged in one package area 100A. As shown in FIG. 2A, a plurality of package areas 100A may be disposed on the same release layer 104' and the substrate (not illustrated), and the package areas 100A may have common alignment marks 200M, and the alignment marks 200M may be disposed around the substrate, for example, at the four corners of the substrate, but it is not limited thereto. Furthermore, as shown in FIG. 2B, in one package area 100A, each electronic unit 50-1 (electronic unit 50-2) may include additional alignment marks 200M, and the alignment marks 200M may be disposed adjacent around the electronic unit 50-1 (electronic unit 50-2), for example, at the four corners, but it is not limited thereto. The alignment mark 200M may have a cross shape, a circle shape, a quadrangle shape, a rectangle shape or any suitable shape, and the present disclosure is not limited thereto. It should be noted that the alignment marks 200M are formed in a manner similar to that of the patterned conductive layer in the aforementioned method of manufacturing the electronic device, and there is no need to engrave marks on the substrate, so that the substrate can be reused and the production cost can be reduced.

In addition, the spacing elements 200F are disposed in such a way that they surround the electronic unit 50-1 (electronic unit 50-2), and the spacing elements 200F can serve as a fence structure to reduce the displacement of the electronic unit 50-1 and the electronic unit 50-2 in the subsequent bonding process or molding process, thereby improving the yield of the packaging technology. In a top view, the spacing element 200F may have a cross shape, a circle shape, a quadrangle shape, a rectangle shape or any suitable shape, and the present disclosure is not limited thereto. The number of spacing elements 200F can also be adjusted as required. In addition, in the top view, an inscribed area FA formed by the spacing elements 200F is larger than the area of the electronic unit 50-1 (electronic unit 50-2). The inscribed area FA formed by the spacing elements 200F may be a rectangle, but it is not limited thereto. In the top view, the inscribed area FA formed by the spacing elements 200F may be, for example, an area surrounded by the tangents of the spacing elements 200F.

Next, refer to FIG. 2C, which further describes the partial structure of the electronic unit 50-1 (electronic unit 50-2). As mentioned above, in accordance with some embodiments, the chip 52 may have a plurality of bonding pads 58, the first insulating layer 54 may be disposed on the chip 52, the first openings 54$p$ of the first insulating layer 54 may be disposed to correspond with the bonding pads 58, and the second openings 56$p$ of the second insulating layer 56 may also be disposed to correspond with the bonding pads 58. That is, in the normal direction of the electronic device (e.g., the Z direction in the drawing), the first opening 54$p$ and the second opening 56$p$ may at least partially overlap the bonding pad 58. In addition, the patterned conductive layer 110$a$ as a part of the connecting member 110 may be disposed in the second openings 56$p$. In accordance with some embodiments, the connecting member 110 may extend into the second openings 56$p$ and the first openings 54$p$ and be electrically connected to the bonding pads 58. In accordance with some embodiments, the materials of the first insulating layer 54 and the second insulating layer 56 may be organic materials, for example, may include polybenzoxazole (PBO), polyimide (e.g., photosensitive polyimide (PSPI)), benzocyclobutene (BCB), build-up material (e.g., Ajinomoto Build-up Film (ABF)), another suitable organic material, or a combination thereof, but they are not limited thereto. In accordance with some other embodiments, the materials of the first insulating layer 54 and the second insulating layer 56 may be inorganic materials, such as silicon nitride, silicon oxide, silicon oxynitride, another suitable inorganic material, or a combination thereof, but they are not limited thereto. In accordance with some embodiments, the first insulating layer 54 and the second insulating layer 56 may be formed by a spin coating process, a chemical vapor deposition (CVD) process, another suitable process, or a combination thereof.

In accordance with some embodiments, the material of the first insulating layer 54 is different from the material of the second insulating layer 56. The coefficient of thermal expansion (CTE) of the first insulating layer 54 may be different from that of the second insulating layer 56. In accordance with some embodiments, the coefficient of thermal expansion (CTE) of the first insulating layer 54 is less than the coefficient of thermal expansion of the second insulating layer 56. In addition, a thickness T1 of the first insulating layer 54 may be different from a thickness T2 of the second insulating layer 56. In accordance with some embodiments, the thickness T1 of the first insulating layer 54 is smaller than the thickness T2 of the second insulating layer 56. In accordance with the embodiments of the present disclosure, the thickness T1 refers to the maximum thickness of the first insulating layer 54 in the normal direction of the electronic device 10 (e.g., the Z direction in the drawing). The thickness T2 refers to the maximum thickness of the second insulating layer 56 in the normal direction of the electronic device 10. With the above configuration, the problem of warpage that may occur in the packaging process can be reduced or the fan-out capability of the electronic device can be improved, thereby improving the reliability of the electronic device.

Figure 4:
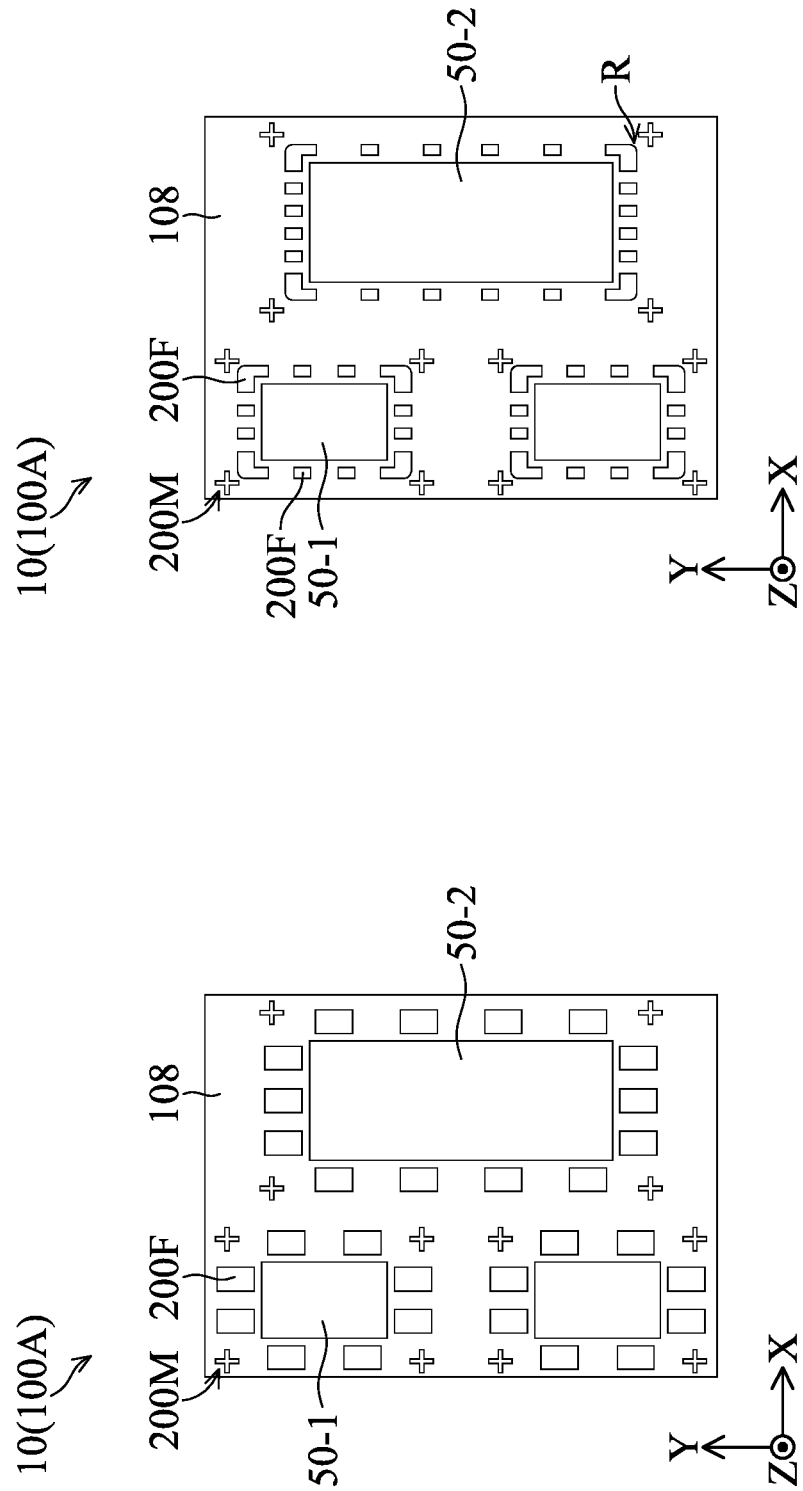
FIG. 4 is a partial top-view diagram of an electronic device in accordance with some embodiments of the present disclosure.
Figure 3:
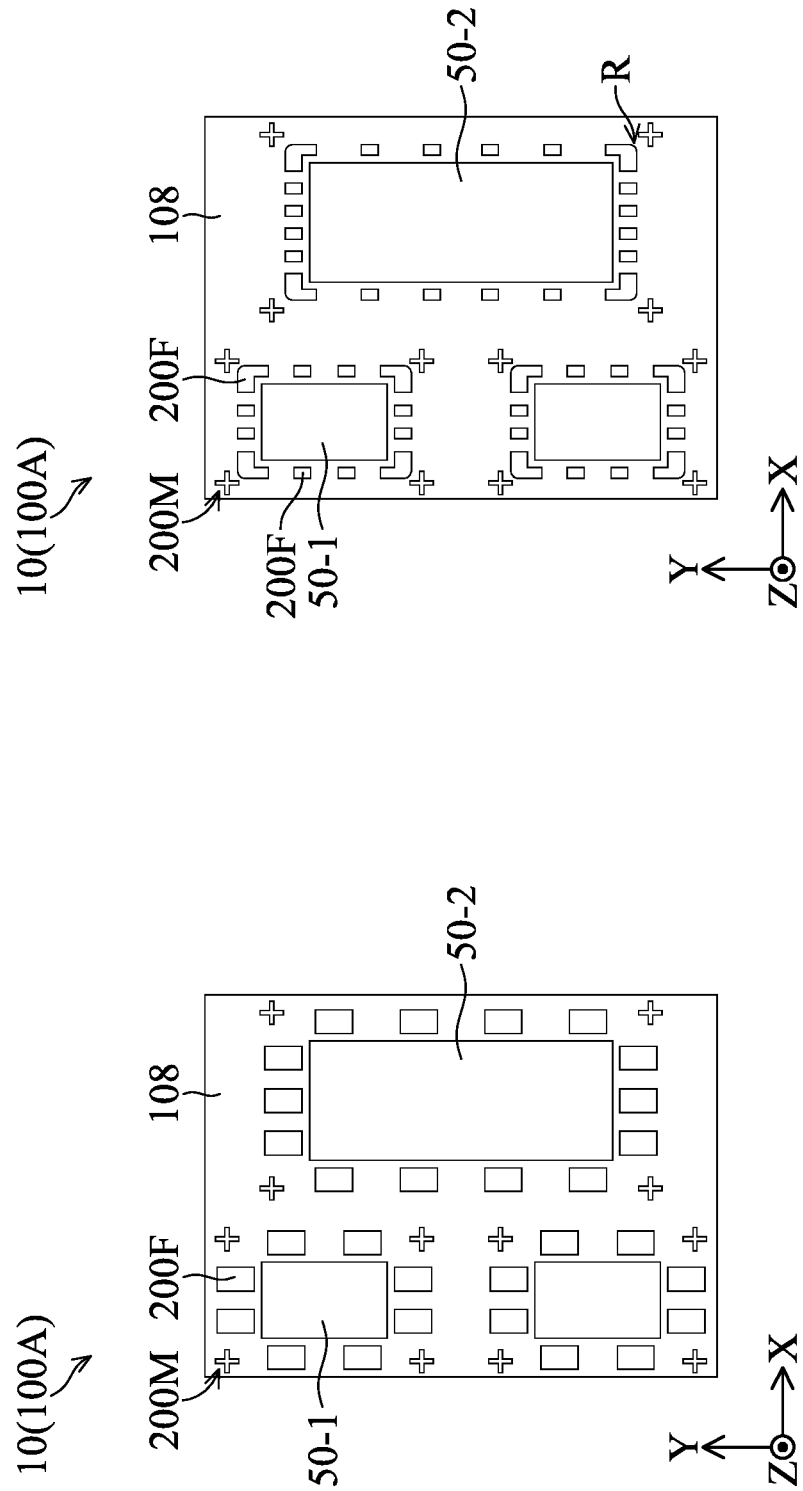
FIG. 3 is a partial top-view diagram of an electronic device in accordance with some embodiments of the present disclosure.

Next, refer to FIG. 3 and FIG. 4, which are partial top-view diagrams of the electronic device 10 in accordance with some other embodiments of the present disclosure. As mentioned above, in the top view, the alignment marks 200M and the spacing elements 200F can have any suitable shape. In the embodiment shown in FIG. 3, the alignment marks 200M have a cross shape, and the spacing elements 200F have a rectangular shape. In the embodiment shown in FIG. 4, the alignment marks 200M also have a cross shape, some of the spacing elements 200F have a rectangular shape, and some of the spacing elements 200F have a bent (curved) shape. In accordance with some embodiments, the spacing elements 200F have a curved edge or an arc angle R and so on. With the design of arc angle or the curved edge, the stress caused by the different thermal expansion coefficients between the contact surfaces of different materials can be reduced, and the risk of cracking can be further reduced, but the present disclosure is not limited thereto.

Next, refer to FIGS. 5A to 5B, which are cross-sectional diagrams of an electronic device 10-1 during different process stages in accordance with some other embodiments of the present disclosure. It should be understood that that the same or similar components or elements in the following paragraphs will be denoted by the same or similar reference numbers, and their materials, manufacturing methods and functions are the same or similar to those described above, and thus they will not be repeated hereafter.

In this embodiment, the method of manufacturing the electronic device 10-1 adopts a chip-first and face-up bonding process. As shown in FIG. 5A, the bonding pads 58 of the electronic unit 50-1 and the electronic unit 50-2 face upward, and the bonding pads 58 are placed farther away from the substrate 102.

Specifically, similar to the steps described in FIG. 1A, the substrate 102 is provided, and the release layer 104 may be formed on the substrate 102. Next, the conductive layer 106 may be formed on the release layer 104, and the conductive layer 106 may serve as a seed layer. After that, the photoresist layer PR may be formed on the conductive layer 106, and the photoresist layer PR may be patterned so that the photoresist layer PR has a plurality of openings. Then, the conductive material may be formed in the openings of the photoresist layer PR and on the exposed portions of the conductive layer 106. That is, the spacing elements 200F and the alignment marks 200M may be formed in the openings of the photoresist layer PR. After the spacing elements 200F and the alignment marks 200M are formed, the photoresist layer PR may be removed. Next, as shown in FIG. 5A, the electronic unit 50-1 and the electronic unit 50-2 are provided, and the electronic unit 50-1 and the electronic unit 50-2 may be placed between the spacing elements 200F. In addition, the electronic unit 50-1 and the electronic unit 50-2 may face upward and be placed farther away from the substrate 102. After the electronic unit 50-1 and the electronic unit 50-2 are placed, the protective layer 108 may be formed to surround the spacing elements 200F, the electronic unit 50-1 and the electronic unit 50-2.

Next, a planarization process may be performed on the protective layer 108 to expose the bonding pads 58 of the electronic unit 50-1 (electronic unit 50-2). In this step, portions of the spacing elements 200F and the alignment marks 200M may also be removed. After the planarization process, the top surfaces of the spacing elements 200F, the alignment marks 200M, the bonding pads 58 and the protective layer 108 may be coplanar.

Referring to FIG. 5B, the patterned conductive layer 110$a$ may be formed on the protective layer 108 and located above the electronic unit 50-1 and the electronic unit 50-2. The patterned conductive layer 110a may be in contact with the bonding pads 58, and the patterned conductive layer 110a may also be in contact with the spacing elements 200F. The spacing elements 200F may be electrically connected to the electronic unit 50-1 (electronic unit 50-2) through the patterned conductive layer 110a. Furthermore, after the patterned conductive layer 110a is formed, the insulating layer 112 may be formed on the patterned conductive layer 110a, and then the insulating layer 112 may be patterned to form the openings (not labeled) that expose portions of the patterned conductive layer 110a. The patterned conductive layer 110b may be formed on the insulating layer 112. The patterned conductive layer 110b may be filled in the openings of the insulating layer 112 and be in contact with the patterned conductive layer 110a, and the patterned conductive layer 110b then may be electrically connected to the patterned conductive layer 110a. In this way, the electronic unit 50-1 may be electrically connected to the electronic unit 50-2 via the connecting member 110 (the patterned conductive layer 110a and the patterned conductive layer 110b).

Referring to FIG. 5B, the insulating layer 114 then may be formed on the insulating layer 112, and the insulating layer 114 may cover the patterned conductive layer 110b. Next, the insulating layer 114 may be patterned to form the openings (not labeled) that expose portions of the patterned conductive layer 110b. In addition, the patterned conductive layer 110c may be formed on the insulating layer 114, the patterned conductive layer 110c may be filled in the openings of the insulating layer 114 and be in contact with the patterned conductive layer 110b, and the patterned conductive layer 110c then may be electrically connected to the patterned conductive layer 110b. Next, the solder pads SB may be formed on the insulating layer 114, and the solder pads SB may be disposed to correspond with the patterned conductive layer 110c.

In accordance with some embodiments, the release layer 104 may be subsequently heated to remove the release layer 104 and the substrate 102 to obtain the electronic device 10-1.

Next, refer to FIGS. 6A to 6D, which are cross-sectional diagrams of an electronic device 10-2 during different process stages in accordance with some other embodiments of the present disclosure. It should be understood that that the same or similar components or elements in the following paragraphs will be denoted by the same or similar reference numbers, and their materials, manufacturing methods and functions are the same or similar to those described above, and thus they will not be repeated hereafter.

In this embodiment, the method of manufacturing the electronic device 10-2 adopts a chip-first and face-down bonding process combined with face-up bonding to form a 3D hetero-integrated structure.

Figure 6A:
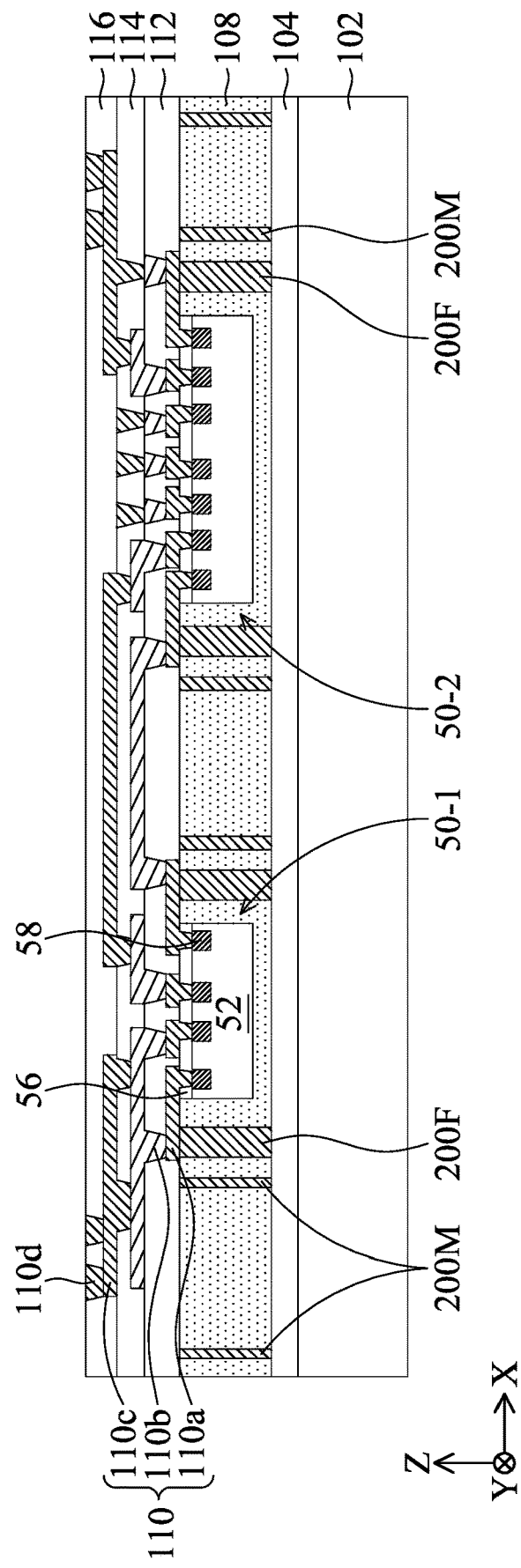
FIGS. 6A to 6D are cross-sectional diagrams of an electronic device during different process stages in accordance with some embodiments of the present disclosure.

As shown in FIG. 6A, the structure shown in FIG. 1E may be formed first, in which the bonding pads 58 of the electronic unit 50-1 and the electronic unit 50-2 may face upward and be placed farther away from the substrate 102. Next, the patterned conductive layer 110c may be formed on the insulating layer 114, and the patterned conductive layer 110c may be filled in the openings of the insulating layer 114 and electrically connected to the patterned conductive layer 110b. In this embodiment, the patterned conductive layer 110a, the patterned conductive layer 110b, and the patterned conductive layer 110c may serve as the first layer of the connecting member 110 (redistribution structure). Next, an insulating layer 116 and a patterned conductive layer 110d may be formed. The materials and processes of forming the insulating layer 116 and the patterned conductive layer 110d can be performed with reference to the steps and processes for forming the insulating layer and the patterned conductive layer of the redistribution structure described above, and thus will not be repeated here. In accordance with some embodiments, the patterned conductive layer 110d may include solder balls, but it is not limited thereto.

Figure 6B:
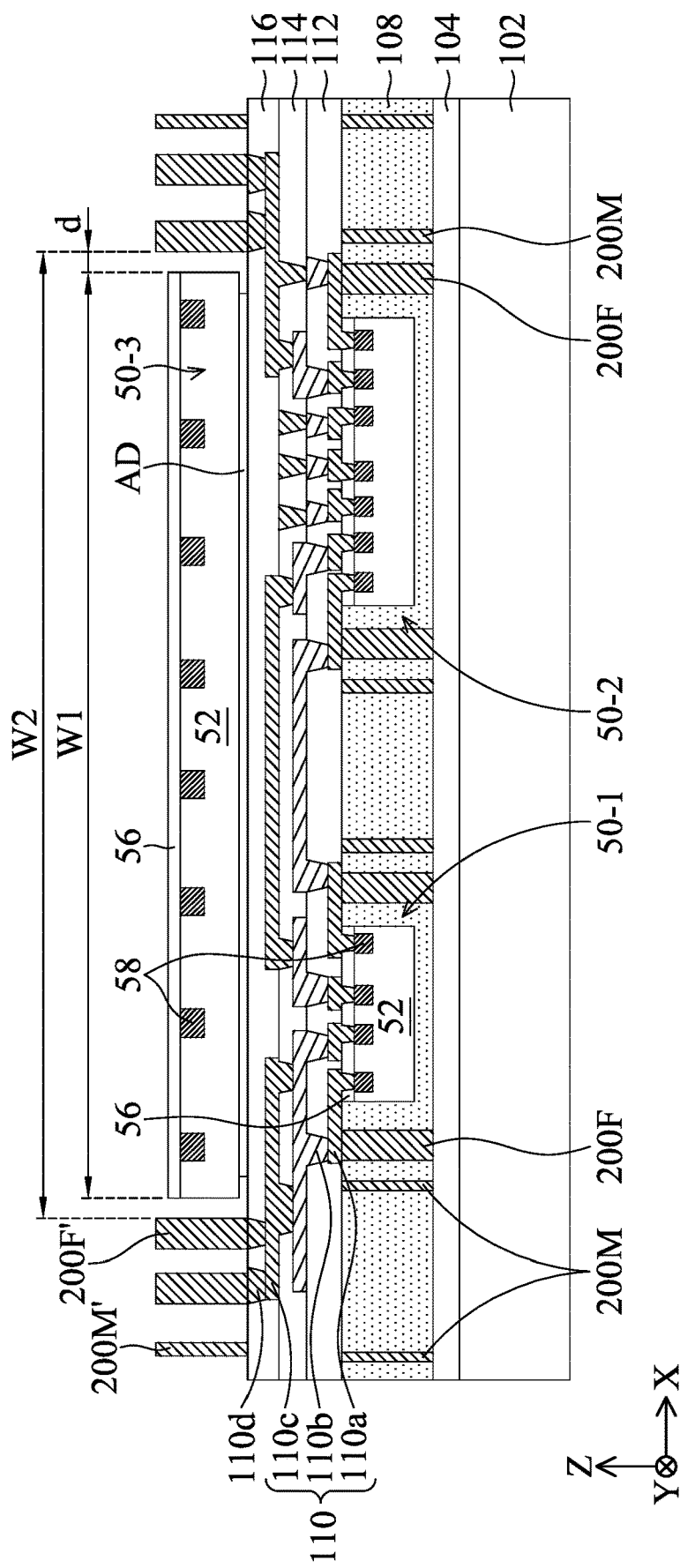

Referring to FIG. 6B, a plurality of spacing elements 200F' and a plurality of alignment marks 200M' then may be formed on the connecting member 110, and the spacing elements 200F' may be electrically connected to the patterned conductive layer 110d. The materials and processes of forming the spacing element 200F' and the alignment mark 200M' may be the same or similar to those of the aforementioned spacing element 200F and the alignment mark 200M, and thus will not be repeated here.

Next, an electronic unit 50-3 may be provided, and the electronic unit 50-3 may be placed between the spacing elements 200F'. Specifically, the electronic unit 50-3 may be disposed between two adjacent spacing elements 200F', and the bonding pads 58 of the electronic unit 50-3 may face upward and be placed farther away from the substrate 102. Furthermore, the electronic unit 50-3 may at least partially overlap the electronic unit 50-1 and/or the electronic unit 50-2 in the normal direction of the electronic device (the substrate 102) (e.g., the Z direction in the drawing). In accordance with some embodiments, the electronic unit 50-3 may be fixed on the insulating layer 116 by an adhesive layer AD. The adhesive layer AD may be any suitable adhesive. For example, in accordance with some embodiments, the adhesive layer AD may include epoxy resin, die attach film (DAF), another suitable adhesive material, or a combination thereof, but it is not limited thereto. In accordance with some embodiments, the adhesive layer AD may contact a surface of the chip 52, and the adhesive layer AD may include a material with heat dissipation function, such as a thermal silicone pad, but it is not limited thereto. The adhesive layer AD may include a glue material with heat dissipation particles, such as epoxy resin including graphite particles or epoxy resin including ceramic heat dissipation particles, but it is not limited thereto.

It should be noted that, before the electronic unit 50-3 is disposed on the insulating layer 116, the spacing elements 200F' have been formed, and the spacing elements 200F' can serve as a fence structure to reduce the displacement of the electronic unit 50-3 in the subsequent bonding process or molding process, thereby improving the yield of the packaging technology.

Similarly, the electronic unit 50-3 may also have a first width W1, and a first distance W2 is between two adjacent spacing elements 200F'. The ratio of the first distance W2 to the first width W1 may be greater than or equal to 1 and less than or equal to 1.3 (i.e. $1 \leq W2/W1 \leq 1.3$), for example, 1.05, 1.1, 1.15, 1.2, or 1.25. In accordance with some embodiments, a second distance d between the electronic unit 50-3 and the spacing element 200F' may be greater than 0 μm and less than or equal to 10 μm (i.e. 0 μm<second distance d≤10 μm), for example, 1 μm, 2 μm, 3 μm, 4 μm, 5 μm, 6 μm, 7 μm, 8 μm or 9 μm.

Figure 6C:
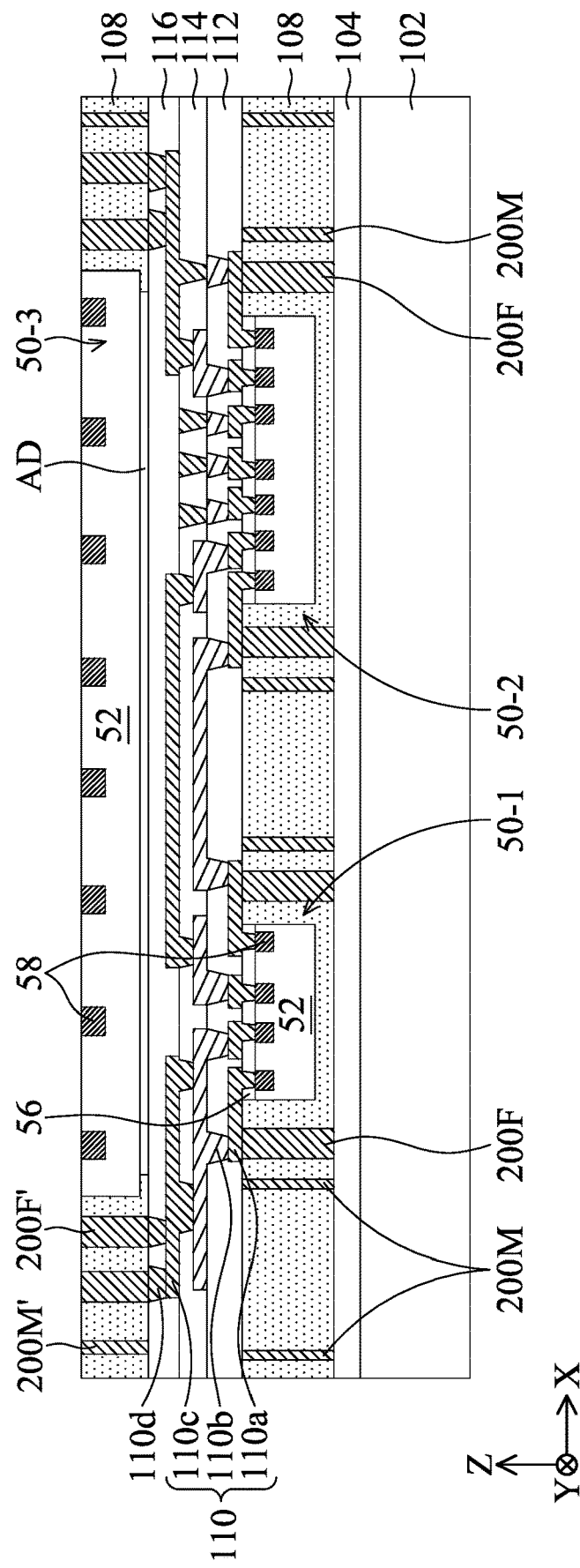

Referring to FIG. 6C, after placing the electronic unit 50-3, the protective layer 108 may be formed to surround the spacing elements 200F', the alignment marks 200M' and the electronic unit 50-3. Furthermore, a planarization process may be performed on the protective layer 108 to expose the bonding pads 58 of the electronic unit 50-3. In this step, portions of the spacing elements 200F' and the alignment marks 200M' may also be removed. After the planarization process, the top surfaces of the spacing elements 200F', the alignment marks 200M', the bonding pads 58, and the protective layer 108 may be coplanar.

Figure 6D:
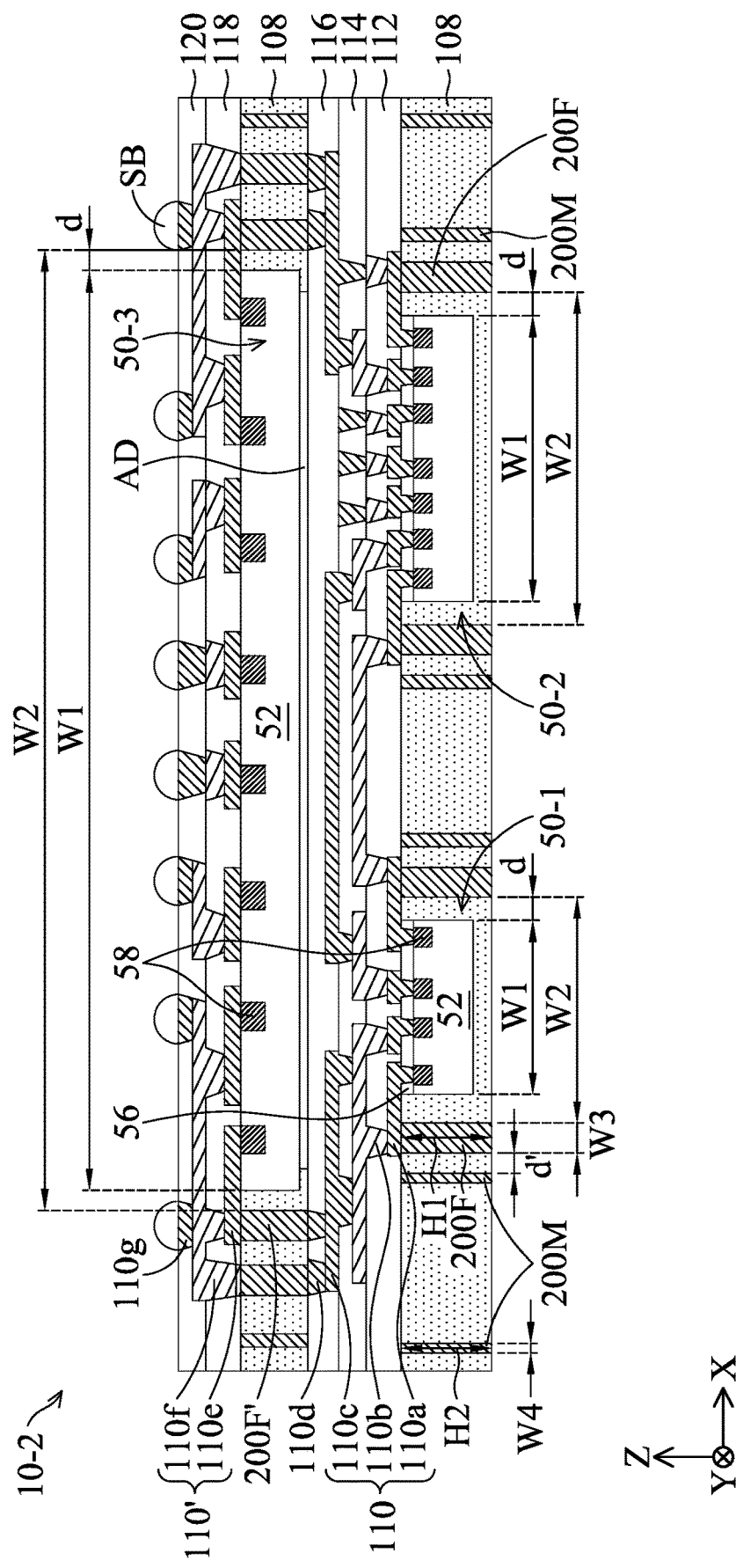

Referring to FIG. 6D, a patterned conductive layer 110e, an insulating layer 118, a patterned conductive layer 110f and an insulating layer 120 then may be sequentially formed on the protective layer 108. The patterned conductive layer 110e and the patterned conductive layer 110f may serve as the second layer of the connecting member 110' (redistribution structure). After that, a patterned conductive layer 110g may be formed on the patterned conductive layer 110f, and solder pads SB may be formed on the insulating layer 120, and the solder pads SB may be disposed to correspond with the patterned conductive layer 110g. The solder pad SB may be a contact bump, and the patterned conductive layer 110g may serve as under bump metallurgy (UBM). The materials and processes of forming the insulating layer 118, the insulating layer 120, the patterned conductive layer 110e, the patterned conductive layer 110f and the patterned conductive layer 110g can be performed with reference to the steps and processes for forming the insulating layer and the patterned conductive layer of the redistribution structure described above, and thus will not be repeated here.

In accordance with some embodiments, the release layer 104 may be subsequently heated to remove the release layer 104 and the substrate 102 to obtain the electronic device 10-2. Furthermore, in accordance with some embodiments, a suitable number of package structures can be further stacked on the electronic unit 50-3 to improve the yield of the FOPLP process.

Figure 7A:
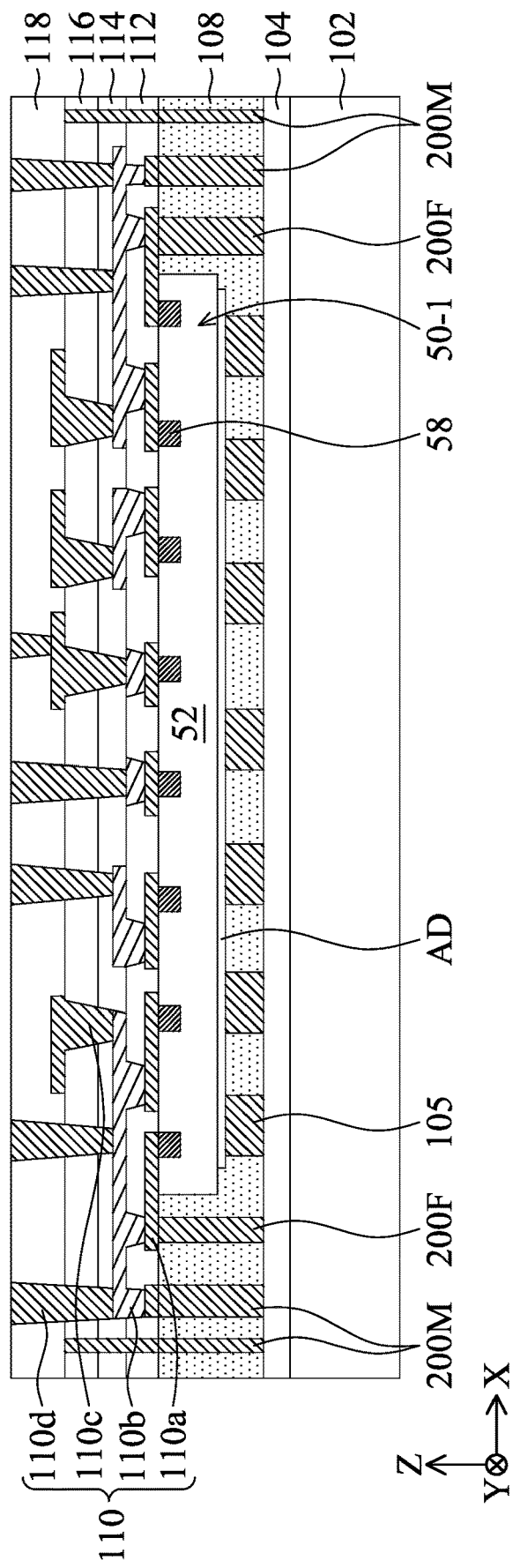
FIGS. 7A to 7B are cross-sectional diagrams of an electronic device during different process stages in accordance with some embodiments of the present disclosure.
Figure 7B:
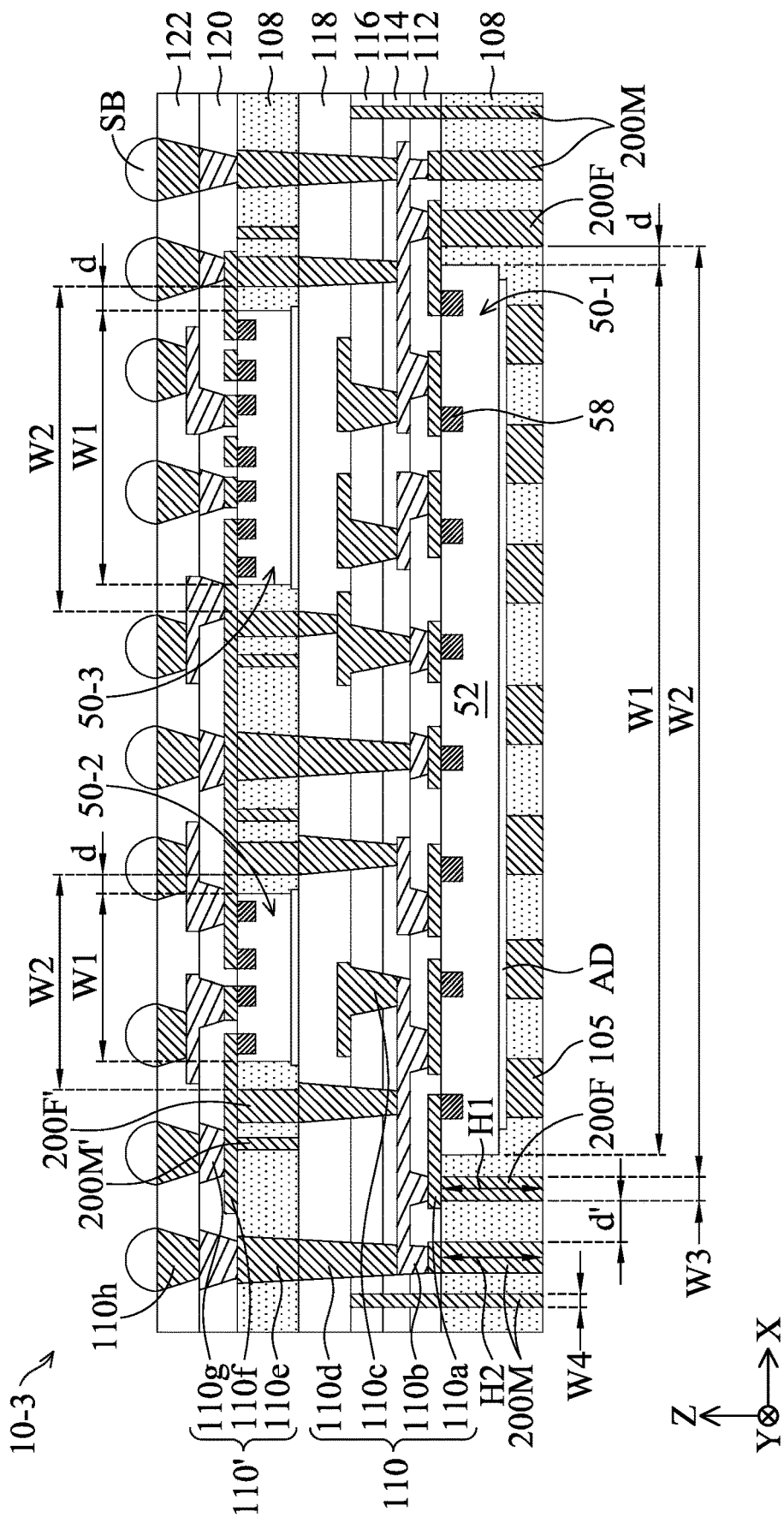

Next, refer to FIGS. 7A to 7B, which are cross-sectional diagrams of an electronic device 10-3 during different process stages in accordance with some other embodiments of the present disclosure. It should be understood that that the same or similar components or elements in the following paragraphs will be denoted by the same or similar reference numbers, and their materials, manufacturing methods and functions are the same or similar to those described above, and thus they will not be repeated hereafter.

In this embodiment, the method of manufacturing the electronic device 10-3 adopts a wafer-first and face-up bonding process combined with face-up bonding to form a 3D hetero-integrated structure.

As shown in FIG. 7A, similar to the steps described in FIG. 1A, the substrate 102 is provided, and the release layer 104 may be formed on the substrate 102. Next, the conductive layer 106 (the seed layer, not illustrated) may be formed on the release layer 104, and then the photoresist layer PR (not illustrated) may be formed on the conductive layer 106. The photoresist layer PR may be patterned so that the photoresist layer PR has a plurality of openings. Next, the conductive material may be formed in the openings of the photoresist layer PR and on the exposed portions of the conductive layer 106. That is, the spacing elements 200F, the alignment marks 200M and conductive elements 10 may be formed in the openings of the photoresist layer PR. It should be noted that, in this embodiment, the conductive elements 105 may serve as a heat sink, and the conductive elements 105 may be formed on the conductive layer 104 before the electronic unit 50-1 is placed. After the spacing elements 200F, the alignment marks 200M and the conductive elements 105 are formed, the photoresist layer PR may be removed. In accordance with some embodiments, the conductive elements 105 may be electrically connected to a printed circuit board (PCB) through the solder pads SB, but it is not limited thereto.

Next, the electronic unit 50-1 may be provided, and the electronic unit 50-1 may be placed between the spacing elements 200F and on the conductive elements 105. The bonding pads 58 of the electronic unit 50-1 may face upward and be placed farther away from the substrate 102. The electronic unit 50-1 may be fixed on the conductive elements 105 by the adhesive layer AD. After the electronic unit 50-1 is placed, the protective layer 108 may be formed to surround the spacing elements 200F, the conductive elements 105, and the electronic unit 50-1. Then, the patterned conductive layer 110a, the insulating layer 112, the patterned conductive layer 110b, the insulating layer 114, the patterned conductive layer 110c, the insulating layer 116, the patterned conductive layer 110d, and the insulating layer 118 may be sequentially formed on the protective layer 108. The patterned conductive layer 110a, the patterned conductive layer 110b, the patterned conductive layer 110c, and the patterned conductive layer 110d may serve as the first layer of the connecting member 110 (redistribution structure).

Referring to FIG. 7B, a plurality of spacing elements 200F' and a plurality of alignment marks 200M' then may be formed on the connecting member 110, and the spacing elements 200F' may be electrically connected to the patterned conductive layer 110d. Next, the electronic unit 50-2 and the electronic unit 50-3 may be provided, and the electronic unit 50-2 and the electronic unit 50-3 may be individually placed between the two adjacent spacing elements 200F'. In addition, the bonding pads 58 of the electronic unit 50-2 and the electronic unit 50-3 may face upward and be placed farther away from the substrate 102. Furthermore, the electronic unit 50-2 and the electronic unit 50-3 may at least partially overlap the electronic unit 50-1 in the normal direction of the substrate 102 (e.g., the Z direction in the drawing). In accordance with some embodiments, the electronic unit 50-2 and the electronic unit 50-3 may be fixed on the insulating layer 118 through the adhesive layer AD.

After the electronic unit 50-2 and the electronic unit 50-3 are placed, the protective layer 108 may be formed to surround the spacing elements 200F', the alignment marks 200M', the electronic unit 50-2 and the electronic unit 50-3. Furthermore, a planarization process may be performed on the protective layer 108 to expose the bonding pads 58 of the electronic unit 50-2 and the electronic unit 50-3. In this step, portions of the spacing elements 200F' and the alignment marks 200M' may also be removed. After the planarization process, the top surfaces of the spacing elements 200F', the alignment marks 200M', the bonding pads 58, and the protective layer 108 may be coplanar.

Referring to FIG. 7B, the patterned conductive layer 110f, the insulating layer 120, the patterned conductive layer 110g, and an insulating layer 122 may be sequentially formed on the protective layer 108. The patterned conductive layer 110e, the patterned conductive layer 110f, and the patterned conductive layer 110g may serve as the second layer of the connecting member 110' (redistribution structure). Next, a patterned conductive layer 110h may be formed on the patterned conductive layer 110g. The solder pads SB may be formed on the insulating layer 122, and the solder pads SB may be disposed to correspond with the patterned conductive layer 110h. The solder pad SB may be a contact bump, and the patterned conductive layer 110h may serve as under bump metallurgy (UBM). The materials and processes of forming the insulating layer 122 and the patterned conductive layer 110f can be performed with reference to the aforementioned steps and processes for forming the insulating layer and the patterned conductive layer of the redistribution structure, and thus will not be repeated here.

In accordance with some embodiments, the release layer 104 may be subsequently heated to remove the release layer 104 and the substrate 102 to obtain the electronic device 10-3. Furthermore, in accordance with some embodiments, a suitable number of package structures can be further stacked on the electronic unit 50-2 and the electronic unit 50-3 to improve the yield of the FOPLP process.

To summarize the above, in accordance with the embodiments of the present disclosure, the electronic device includes the spacing elements that can be used as a fence structure, and the electronic unit is disposed between the spacing elements. In this way, the displacement of the electronic unit during the bonding process or the molding process can be controlled, thereby improving the yield of the packaging technology. Furthermore, the spacing elements can also be used as a conductive element for providing electrical connection between elements or for providing a heat dissipation function. In addition, in accordance with some embodiments of the present disclosure, the electronic device includes the alignment marks adjacent to the spacing elements. Therefore, there is no need to engrave marks on the substrate, so that the substrate can be reused and the production cost can be reduced.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electronic device, comprising:
a plurality of spacing elements;
a first electronic unit and a second electronic unit individually disposed between two adjacent spacing elements;
a protective layer surrounding the plurality of spacing elements, the first electronic unit and the second electronic unit;
an alignment mark, wherein the protective layer surrounds the alignment mark; and
a connecting member, wherein the first electronic unit is electrically connected to the second electronic unit via the connecting member,
wherein the electronic device has a normal direction, and in a direction that is perpendicular to the normal direction, the first electronic unit has a first width, and a first distance is between the two adjacent spacing elements, and a ratio of the first distance to the first width is greater than or equal to 1 and less than or equal to 1.3,
wherein a material of the alignment mark is the same as a material of the plurality of spacing elements.

2. The electronic device as claimed in claim 1, wherein the two adjacent spacing elements are electrically connected to the first electronic unit via the connecting member.

3. The electronic device as claimed in claim 1, wherein in the normal direction, one of the spacing elements has a first height, the alignment mark has a second height, and a ratio of the second height to the first height is greater than or equal to 0.5 and less than or equal to 1.2.

4. The electronic device as claimed in claim 1, wherein the first electronic unit comprises:
a chip having a plurality of bonding pads;
a first insulating layer disposed on the chip, and the first insulating layer having a plurality of first openings, wherein the plurality of first openings are disposed to correspond with the plurality of bonding pads; and
a second insulating layer disposed on the first insulating layer, and the second insulating layer having a plurality of second openings, wherein the plurality of second openings are disposed to correspond with the plurality of bonding pads,
wherein the connecting member extends into the plurality of second openings and the plurality of first openings and is electrically connected to the plurality of bonding pads.

5. The electronic device as claimed in claim 4, wherein a material of the first insulating layer is different from a material of the second insulating layer.

6. The electronic device as claimed in claim 4, wherein a thickness of the first insulating layer is smaller than a thickness of the second insulating layer.

7. The electronic device as claimed in claim 4, wherein a coefficient of thermal expansion of the first insulating layer is different from a coefficient of thermal expansion of the second insulating layer.

8. The electronic device as claimed in claim 1, wherein one of the spacing elements has a second width, the alignment mark has a third width, and the third width is less than or equal to half of the second width.

9. The electronic device as claimed in claim 1, wherein an inscribed area formed by the plurality of spacing elements is larger than an area of the first electronic unit.

10. The electronic device as claimed in claim 1, wherein the plurality of spacing elements have a curved edge or an arc angle.

11. A method of manufacturing an electronic device, comprising:
providing a substrate;
forming a photoresist layer on the substrate, the photoresist layer having a plurality of openings;
forming a plurality of first spacing elements in the plurality of openings;
forming a plurality of alignment marks in the plurality of openings of the photoresist layer;
removing the photoresist layer; and providing a first electronic unit and a second electronic unit, wherein the first electronic unit and the second electronic unit are individually disposed between two adjacent first spacing elements;

wherein the electronic device has a normal direction, and in a direction that is perpendicular to the normal direction, the first electronic unit has a first width, and a first distance is between the two adjacent first spacing elements, and a ratio of the first distance to the first width is greater than or equal to 1 and less than or equal to 1.3, wherein the plurality of alignment marks and the plurality of first spacing elements are formed in the same process.

12. The method of manufacturing an electronic device as claimed in claim 11, after the step of providing the first electronic unit and the second electronic unit, further comprising:

forming a protective layer surrounding the plurality of first spacing elements, the first electronic unit and the second electronic unit.

13. The method for manufacturing an electronic device as claimed in claim 11, before the step of forming the photoresist layer on the substrate, further comprising:

forming a conductive layer between the substrate and the photoresist layer.

14. The method of manufacturing an electronic device as claimed in claim 13, wherein the conductive layer is a composite layer.

15. The method of manufacturing an electronic device as claimed in claim 11, further comprising:

forming a connecting member on the first electronic unit and the second electronic unit, wherein the first electronic unit is electrically connected to the second electronic unit via the connecting member.

16. The method of manufacturing an electronic device as claimed in claim 15, further comprising:

forming a plurality of second spacing elements on the connecting member; and providing a third electronic unit, wherein the third electronic unit at least partially overlaps the first electronic unit in the normal direction, and the third electronic unit is disposed between the two adjacent second spacing elements.

* * * * *